(12) United States Patent
Maeno

(10) Patent No.: US 6,943,568 B2
(45) Date of Patent: Sep. 13, 2005

(54) CHARGING VOLTAGE MEASURING DEVICE FOR SUBSTRATE AND ION BEAM IRRADIATING DEVICE

(75) Inventor: Shuichi Maeno, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 10/665,262

(22) Filed: Sep. 22, 2003

(65) Prior Publication Data

US 2004/0189329 A1 Sep. 30, 2004

(30) Foreign Application Priority Data

Sep. 20, 2002 (JP) ..................................... P2002-274826

(51) Int. Cl.[7] ...................... G01R 19/00; G01R 31/303; H05H 1/00
(52) U.S. Cl. .................... 324/686; 324/751; 156/345.28
(58) Field of Search ............................... 324/500, 501, 324/686, 713, 750, 751, 765; 156/345.24, 345.28; 702/57, 65

(56) References Cited

U.S. PATENT DOCUMENTS

| | | | | |
|---|---|---|---|---|
| 4,335,314 A | * | 6/1982 | Geerk et al. | 250/492.3 |
| 4,636,724 A | * | 1/1987 | Fukuda et al. | 324/527 |
| 5,030,908 A | * | 7/1991 | Miyoshi et al. | 324/752 |
| 6,651,582 B2 | * | 11/2003 | Sakai et al. | 118/723 R |
| 6,788,074 B2 | * | 9/2004 | Sarma et al. | 324/663 |

FOREIGN PATENT DOCUMENTS

| | | |
|---|---|---|
| JP | 09-054130 | 2/1997 |
| JP | 10-027566 | 1/1998 |

* cited by examiner

*Primary Examiner*—Ernest Karlsen
(74) *Attorney, Agent, or Firm*—Finnegan, Henderson, Farabow, Garrett & Dunner, L.L.P.

(57) ABSTRACT

The charging voltage measuring device includes a measuring electrode for forming an electrostatic capacity Cs with a substrate disposed on a substrate holding unit, a measuring capacitor, which has an electrostatic capacity Cm, being connected between the measuring electrode and a ground potential portion, and, a voltage measuring unit for measuring a measuring voltage Vm across the measuring capacitor, and a calculating unit. The calculating unit 22 calculates the charging voltage Vs on the surface of the substrate at time t1 in accordance with the following numerical expression on the basis of the measuring voltage Vm(t1) at time t1, an inverse K of a voltage dividing ratio and a resistance value Rm of a resistor disposed in parallel to the measuring capacitor 18, when the measurement time is t1.

$$Vs = K[Vm(t1) + \{1/(Cm \cdot Rm)\}\int_0^{t1} Vm(t)dt]$$

where $K=(Cs+Cm)/Cs$ or $K=Cm/Cs$ (if $Cm \gg Cs$).

3 Claims, 7 Drawing Sheets

CHARGING VOLTAGE MEASURING DEVICE FOR SUBSTRATE AND ION BEAM IRRADIATING DEVICE

BACKGROUND OF THE INVENTION

1. Field of the Invention

The present invention to a charging voltage measuring device and an ion beam irradiating device having a charging voltage measuring device which is employed in a process or apparatus for making ion implantation, ion doping or plasma treatment on a substrate, or a process or apparatus for conveying or drying the substrate, in which there is a fear that the surface of the substrate is electrified.

2. Description of the Related Art

Referring to FIGS. 1 and 2, a related-art typical charging voltage measuring method employing no electrostatic chuck will be described below by way of example.

First of all, when a substrate 6 is treated, a measuring electrode 8 is not provided, the substrate 6 to be treated is held and secured on a substrate holding unit 4 by a damper (not shown), and irradiated with an ion beam 2. In this way, the substrate 6 is treated with the ion implantation and ion doping.

The substrate holding unit 4 is a metallic plate, for example. The substrate 6 is a glass substrate for liquid crystal display, for example, but may be a semiconductor substrate or the like.

If the ion beam 2 is applied onto the substrate 6, the surface of the substrate 6 is electrified (charged up) due to positive charges of ions in the ion beam 2. Especially when the substrate 6 has an insulating property (electrical insulating property), the surface of the substrate 6 is more likely to be electrified. The glass substrate and the semiconductor substrate having an insulating layer on the surface are exemplary. At this time, the charging voltage on the substrate surface is simply decided by the balance between ions radiated as the ion beam 2 and electrons supplied to the substrate 6 along with the ion beam 2. The electrons may be those in a plasma existing around the ion beam 2 or those being supplied from an electron supply source as will be described later.

In order to measure the charging voltage on the surface of the substrate 6 as above described, a metallic measuring electrode 8 was placed closely on the surface of the substrate 6, and the ion beam 2 was applied onto the measuring electrode to measure the voltage of the measuring electrode 8 by a voltmeter 10, whereby the measured voltage was regarded as the charging voltage on the substrate surface. When the substrate 6 was actually treated by applying the ion beam 2 thereto, the measuring electrode 6 as an obstacle was removed.

With the related-art measuring method as above described, it is required to place the measuring electrode 8 on the surface of the substrate 6, whereby the charging voltage on the surface of the substrate 6 can not be measured during the actual treatment (e.g., ion implantation).

Also, in measuring the charging voltage, the ion beam 2 is applied onto the metallic measuring electrode 8, whereby the charging voltage on the substrate surface is not correctly measured due to a difference in the material between the surface of the substrate 6 and the surface of the measuring electrode 8.

SUMMARY OF THE INVENTION

It is an object of the present invention to provide a device capable of accurately measuring the charging voltage on the substrate surface that is actually treated.

According to a first aspect of the invention, there is provided with a charging voltage measuring apparatus for measuring a charging voltage $V_s$ on the surface of a substrate on a substrate holding unit, including:

a measuring electrode, for forming an electrostatic capacity $C_s$ with said substrate, being disposed on said substrate holding unit to make contact with or proximate to the back face of said held substrate, and said measuring electrode being electrically insulated from said substrate holding unit;

a measuring capacitor connected between said measuring electrode and a ground potential portion, said measuring capacitor having an electrostatic capacity $C_m$;

a voltage measuring unit for measuring a measuring voltage $V_m$ between both ends of said measuring capacitor;

and a calculating unit for calculating said charging voltage $V_s$ in accordance with a following numerical expression 1 or its mathematically equivalent numerical expression on the basis of an inverse $K$ of a voltage dividing ratio that is defined by the relation of said electrostatic capacities $C_s$ and $C_m$ and said measuring voltage $V_m$.

$$V_s = K \cdot V_m \quad \text{[Numerical expression 1]}$$

where $K=(C_s+C_m)/C_s$ or $K=C_m/C_s$ (if $C_m \gg C_s$)

This numerical expression 1 is the same as that of claim 1.

In this charging voltage measuring device according to the first aspect of the present invention, the two electrostatic capacities $C_s$ and $C_m$ are connected in series with each other, so that the charging voltage $V_s$ on the substrate surface during the treatment that is divided at the voltage dividing ratio defined by the relation between the two electrostatic capacities $C_s$ and $C_m$ appears across the measuring capacitor. This voltage is measured as the measuring voltage by the voltmeter.

Accordingly, the charging voltage on the substrate surface during the actual treatment can be accurately obtained from the measured voltage $V_m$ by multiplying the measuring voltage by the inverse $K$ of the voltage dividing ratio as indicated in the numerical expression 1.

According to the second aspect of the invention, there is provided with a charging voltage measuring device apparatus for measuring a charging voltage $V_s$ on the surface of a substrate held on a substrate holding unit, including:

a measuring electrode, for forming an electrostatic capacity $C_s$ with said substrate, being disposed on said substrate holding unit to make contact with or proximate to the back face of said held substrate, and said measuring electrode being electrically insulated from said substrate holding unit;

a measuring capacitor connected between said measuring electrode and a ground potential portion, said measuring capacitor having an electrostatic capacity $C_m$;

a voltage measuring unit for measuring a measuring voltage $V_m$ between both ends of said measuring capacitor; and a calculator calculating unit for calculating said charging voltage $V_s$ at time $t1$ in accordance with a following numerical expression 2 or its mathematically equivalent numerical expression on the basis of an inverse $K$ of a voltage dividing ratio that is defined by the relation between said electrostatic capacities $C_s$ and $C_m$, and said measuring voltage $V_m(t1)$ at time $t1$, and a resistance value $R_m$ of a resistor including an internal resistor of said voltmeter and disposed in parallel to said measuring capacitor, when the time is $t$, the measurement start time is $t=0$, and the measurement time is $t1$.

$$V_s = K[V_m(t1) + \{1/(C_m \times R_m)\} \int_0^{t1} V_m(t)dt] \quad \text{[Numerical expression 2]}$$

where $K=(C_s+C_m)/C_s$ or $K=C_m/C_s$ (if $C_m \gg C_s$)

The numerical expression 2 is the same as that of claim 2.

$$Vs=K[Vm(t1)+\{1/(Cm \cdot Rm)\}\int_0^{t1} Vm(t)dt]$$ [Numerical expression 2]

where K=(Cs+Cm)/Cs or K=Cm/Cs (if Cm>>Cs)

A portion of the first term multiplied by K within the large brackets in the numerical expression 2 has the almost same content as in the numerical expression 1.

The second term within the large brackets in the numerical expression 2 is provided for correcting for an amount of charges on the substrate surface leaking into the ground potential portion through the resistor in parallel to the measuring capacitor during the measurement by converting it into the voltage. The voltage in the second term is obtained across the measuring capacitor, and converted into the voltage on the surface of the substrate by multiplying the second term by K. In this way, correcting the voltage for an error due to charges leaking out via the internal resistance in the voltmeter, the charging voltage Vs on the substrate surface during the actual treatment is accurately measured.

According to the third aspect of the invention, there is provided with an ion beam irradiating apparatus for irradiating an ion beam onto a substrate held on a substrate holding unit, including:

an plasma generating source for generating and supplying electrons to said substrate to suppress the electrification on the surface of said substrate caused by irradiating said ion beam;

a charging voltage measuring device for the substrate according to the first or second aspect of the invention; and a control unit for controlling an amount of electrons generated from said electron supply source on the basis of charging voltage Vs measured by said charging voltage measuring device;

wherein said control unit controls to maintain said amount of said electrons generated from said electron supply source when said charging voltage Vs is within a reference voltage range, wherein said control unit controls to increase said amount of said electrons generated from said electron supply source when said charging voltage Vs is higher than said reference voltage range, and wherein said control unit controls to decrease said amount of said electrons generated from said electron supply source when said charging voltage Vs is lower than said reference voltage range.

Since this ion beam irradiating device has the charging voltage measuring device according to first or second aspect of the invention, the charging voltage Vs on the substrate surface during the actual treatment is accurately measured.

Additionally, the controller makes the feedback control for the electron discharge source to automatically control the charging voltage Vs on the substrate surface during the treatment to fall within the reference voltage range.

DETAILED DESCRIPTION OF THE INVENTION

Figure 1:
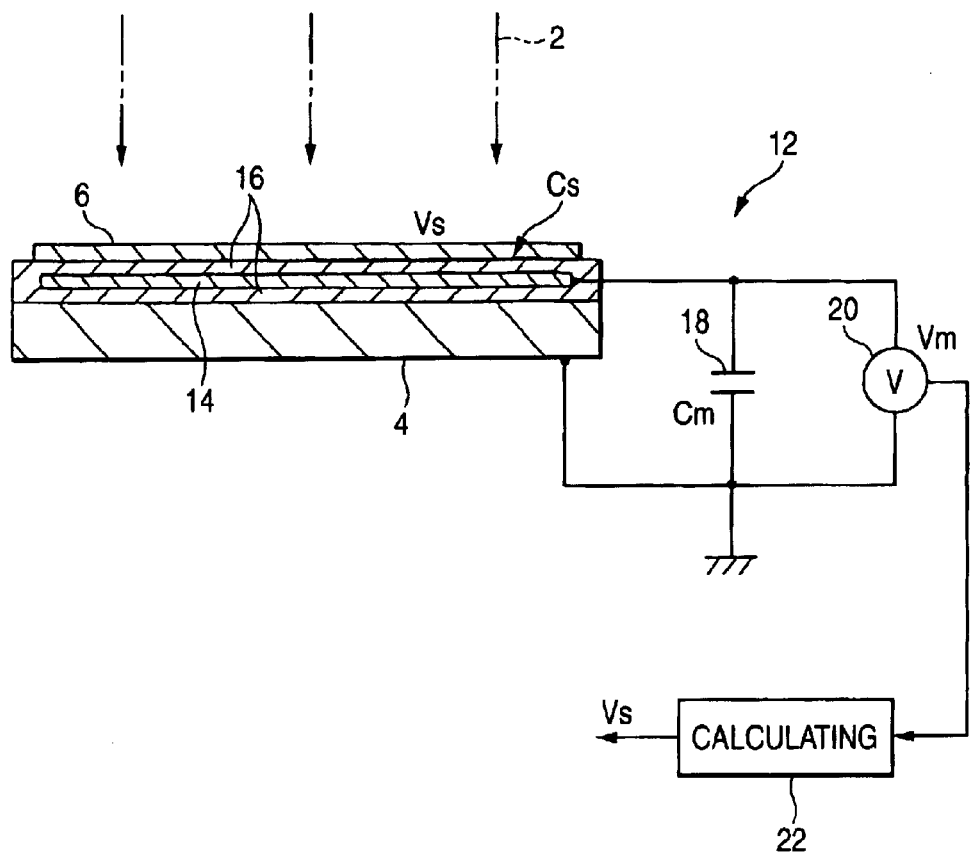
FIG. 1 is a diagram showing a charging voltage measuring device according to one embodiment of the present invention.
Figure 2:
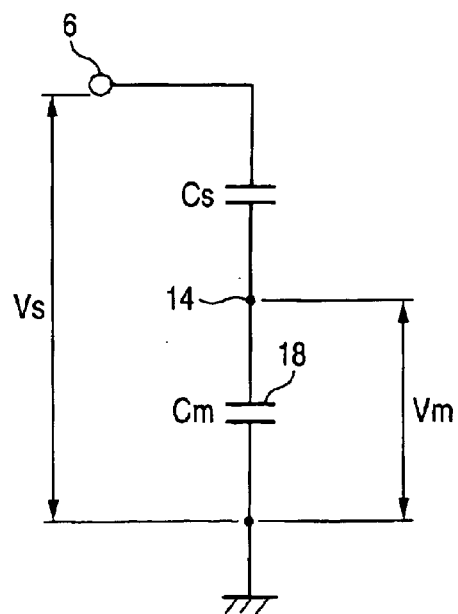
FIG. 2 is an equivalent circuit diagram around a measuring capacitor in FIG. 1.

FIG. 1 is a diagram showing a charging voltage measuring device according to one embodiment of the present invention. FIG. 2 is an equivalent circuit diagram around a measuring capacitor in FIG. 1. The same or like parts are designated by the same numerals as in the related-art example of FIG. 12, and the different points from the related-art example will be mainly described below.

This charging voltage measuring device 12 includes a measuring electrode 14, a measuring capacitor 18, a voltage measuring unit and a calculating unit. In this embodiment, the voltage measuring and the calculating units are a voltmeter 20 and the calculator 22, respectively.

The measuring electrode 14 is disposed between a substrate holding unit 4 and a substrate 6. The substrate 6 is held on the measuring electrode 14. The measuring electrode 14 is disposed on the substrate holding unit 4 (i.e., on a substrate holding face of the substrate holding unit 4) to make contact with or proximate to the back face of the substrate 6 held thereon, and electrically insulated from the substrate holding unit 4 to form an electrostatic capacity Cs with the substrate 6.

The measuring electrode 14 is a plate-like (particularly, a thin plate-like) conductor (i.e., a conductive plate), The measuring electrode 14 is covered with a thin insulating layer 16, including both the upper and lower faces thereof in this embodiment. The substrate 6 is held and secured on this insulating layer. Accordingly, the measuring electrode 14 is located proximate to the back face of the substrate 6 via the insulating layer 16. Usually, the substrate 6 is held and secured by securing unit such as a clamper, not shown. The damper is not shown in the drawings.

Since the substrate holding unit 4 is made of a conductor such as a metal, the insulating layer 16 is also provided between the substrate holding unit 4 and the measuring electrode 14 in this example. However, if at least the surface of the substrate holding unit 4 is an insulating material, it is unnecessary to provide the insulating layer 16 between the substrate holding unit 4 and the measuring electrode 14. This is because the potential of the measuring electrode 14 is taken out, even if there is no insulating layer 16. The substrate holding unit 4 is electrically connected to a ground potential portion in this embodiment.

Also, when the substrate 6 is made of an insulating material like a glass, there is no need for providing the insulating layer 16 between the substrate 6 and the measuring electrode 14. This is because an electrostatic capacity Cs is formed between the substrate 6 and the measuring electrode 14, even if the insulating layer 16 is not provided. In this case, the measuring electrode 14 makes contact with the back face of the substrate 6. When the substrate 6 is electrically conductive, the insulating layer 16 may be provided between the substrate 6 and the measuring electrode 14.

More specifically, the measuring electrode 14 made of an aluminum foil, which is laminated with the insulating layer 16. The insulating layer 16 is made of polyethylene. The measuring electrode 14 is bonded on the substrate holding unit 4 in this embodiment. Since such measuring electrode 14 can be very thin as a whole, there is an excellent thermal conductivity between the substrate 6 and the substrate holding unit 4, which is advantageous for efficiently cooling the substrate via the substrate holding unit 4 during the treatment. The substrate holding unit 4 is cooled by refrigerant such as the cooling water to cool the substrate 6 efficiently in this embodiment.

Figure 5:
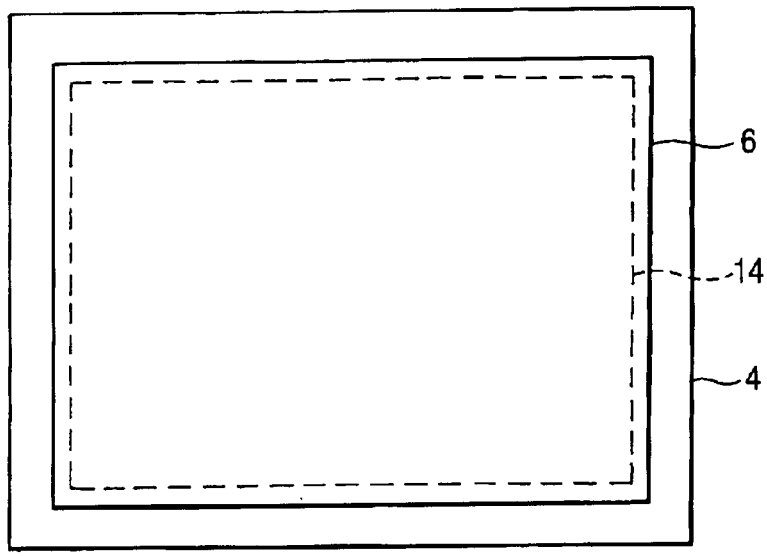
FIG. 5 is a plan view showing one example of planar shape for the substrate holding unit, the substrate and the measuring electrode.

FIG. 5 shows one example of a planar shape for the substrate holding unit 4, the substrate 6 and the measuring electrode 14. In this example, the measuring electrode 14 is slightly smaller than the substrate 6 to prevent an ion beam 2 from being applied on top of the measuring electrode 14 without being intercepted by the substrate 6. However, the planar shape is not limited to this example (e.g., see FIGS. 10 and 11).

Figure 7:
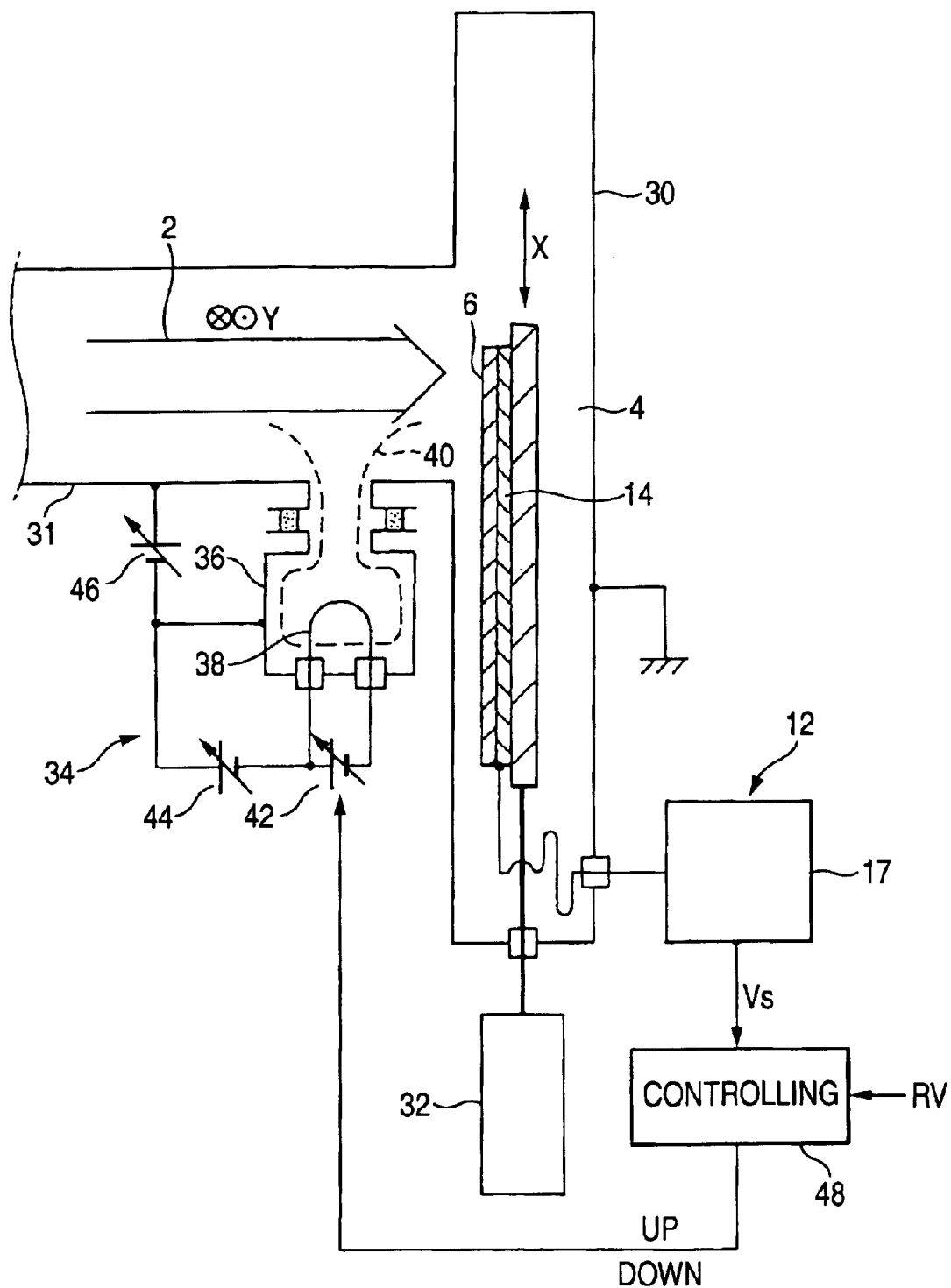
FIG. 7 is a schematic cross-sectional view showing an ion beam irradiating device according to one embodiment of this invention.
Figure 9:
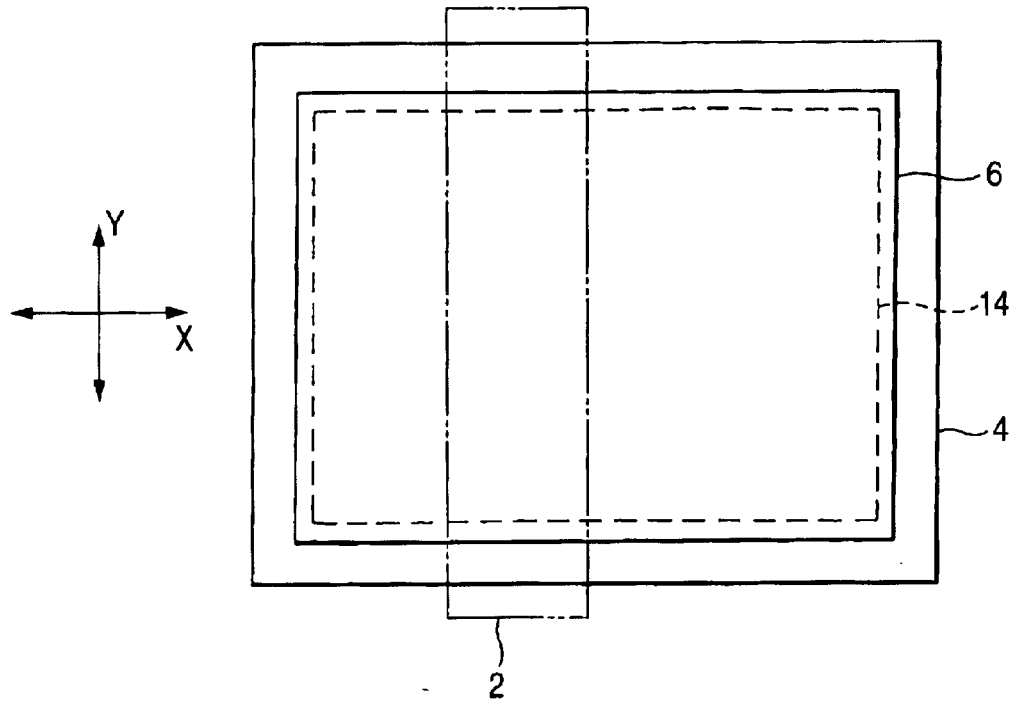
FIG. 9 is a plan view showing one example of planar shape for the substrate holding unit, the substrate and the measuring electrode along with the ion beam.

The ion beam 2 may have a large area to cover the entire substrate 6, or may have a rectangular section as shown in FIG. 9, when mechanically scanning the substrate holding unit 4 and the substrate 6, as shown in FIG. 7. Other shapes maybe employed.

Turning back to FIG. 1, the measuring capacitor 18 is connected between the measuring electrode 14 and the ground potential portion. Let its electrostatic capacity be Cm. The ground potential portion is a vacuum vessel (e.g., a vacuum vessel 30 in FIG. 7) for storing and treating the substrate holding unit 4, for example.

The voltmeter 20 is connected across the measuring capacitor 18 to measure the measuring voltage Vm that is a voltage across the measuring capacitor 18.

The calculator 22 calculates the charging voltage Vs on the surface of the substrate 6 being treated in accordance with the numerical expression 3, on the basis of the inverse K of the voltage dividing ratio that is defined by the measuring voltage Vm measured by the voltmeter 20 and the electrostatic capacities Cs and Cm.

Explaining in more detail, in this charging voltage measuring device 12, two electrostatic capacities Cs and Cm are connected in series between the substrate 6 and the ground potential portion, so that the charging voltage Vs on the surface of the substrate 6 being treated that is divided at a voltage dividing ratio defined by the relation between the two electrostatic capacities Cs and Cm (which is obtained by the well known method) appears across the measuring capacitor 18, as shown in FIG. 2. This voltage is measured as the measuring voltage Vm by the voltmeter 20. Herein, the internal resistor of the voltmeter 20 is sufficiently large and ignored.

Accordingly, the charging voltage Vs on the substrate surface during the actual treatment can be accurately calculated from the measuring voltage Vm by multiplying the measuring voltage Vm by the inverse K of the voltage dividing ratio, as indicated in the numerical expression 3. This calculator 22 makes the calculation.

Figure 3:
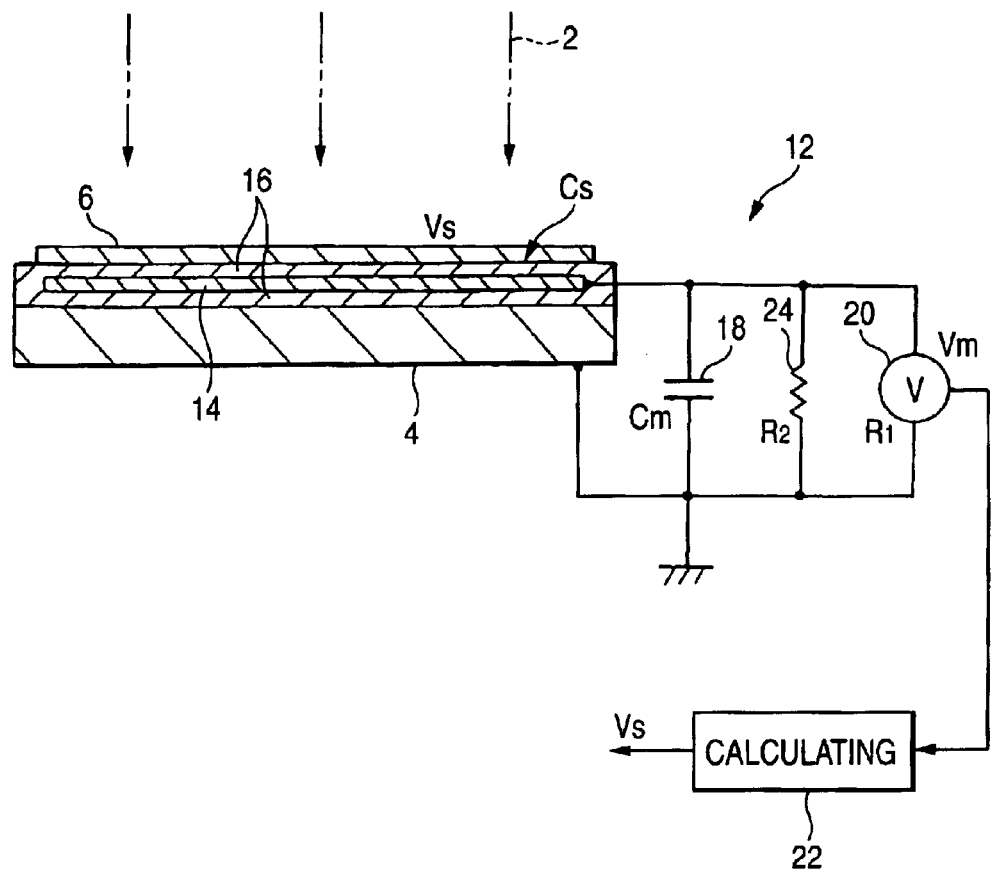
FIG. 3 is a view showing a charging voltage measuring device according to another embodiment of the invention.

The measuring voltage Vm measured by the voltmeter 20 includes the polarity ± and the magnitude, and therefore the charging voltage Vs calculated in the above way by the calculator 22 includes the polarity ± and the magnitude. The same is true with the charging voltage measuring device 12 as shown in FIG. 3.

The inverse K of the voltage dividing ratio is correctly represented by the following numerical expression 5. When Cm>>Cs (e.g., Cm is about 100 to 10000 times Cs), the numerical expression 6 may be alternatively employed without having great influence on the measuring accuracy.

$$K=(Cs+Cm)/Cs \qquad \text{[Numerical expression 3]}$$

$$K=Cm/Cs \qquad \text{[Numerical expression 4]}$$

The value of K may be calculated within the calculator 22, or by may be calculated in other ways and set in the calculator 22, whereby the calculator 22 makes the calculation in accordance with the numerical expression 1 or 2. Thereby, the arithmetical operation of the calculator 22 is simplified. The correct measuring method for K will be described later.

The charging voltage Vs on the substrate surface during the treatment may be reach several hundreds to about 1000V, unless the neutralization by electrons is made appropriately. To divide such high charging voltage Vs into the measuring voltage Vm of about several volts suitable for the measurement, it is preferred that the electrostatic capacity Cm of the measuring capacitor 18 is decided so that the value of K may be about 100 to 10000, or preferably about 1000. In the example as shown in FIG. 7, when the ion beam 2 mechanically scans the substrate holding unit 4 and the substrate 6, it is confirmed that the charging voltage Vs is varied over time. In such a case, to enhance the measurement precision by extending the time constant of the measuring circuit, it is preferred that the electrostatic capacity Cm of the measuring capacitor 18 is decided to set the value of K to the above value. This is especially preferable for the charging voltage measuring device 12 as shown in FIG. 3.

Figure 12:
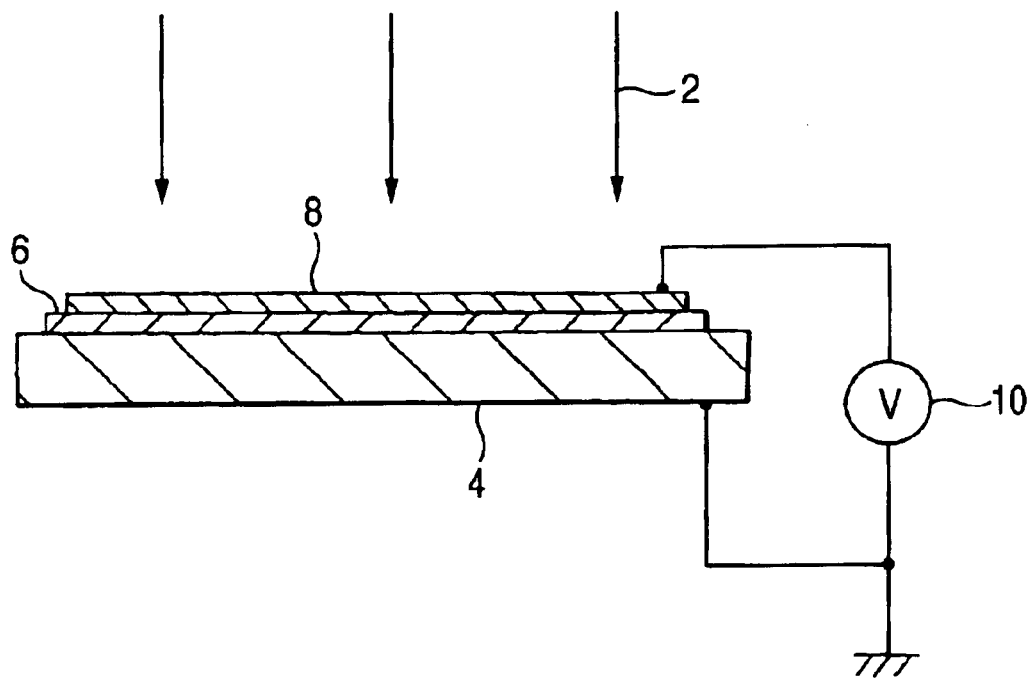
FIG. 12 is a view showing one example of the related-art charging voltage measuring method.

As described above, with this charging voltage measuring device 12, there is no need for disposing the measuring electrode 8 on the substrate 6 in contrast to the related-art technique, and the measuring electrode 14 that is not obstacle for treating the substrate 6 is employed, whereby the charging voltage Vs on the surface of the substrate 6 during the actual treatment is measured in real time, as shown in FIG. 12.

And the charging voltage Vs on the surface of the substrate 6 itself being actually treated is measured employing voltage dividing unit with two electrostatic capacities Cs and Cm in contract to the related-art technique as shown in FIG. 12, whereby the charging voltage Vs on the surface of the substrate 6 is accurately measured without risk that the measurement precision is decreased due to a difference between the surface materials.

By the way, in the charging voltage measuring device 12 as shown in FIG. 1, the internal resistor of the voltmeter 20 is sufficiently large, whereby it is ignored that charges on the surface of the substrate 6 leak into the ground potential portion via the internal resistor of the voltmeter 20 during the measurement. If the charging voltage Vs is corrected for the amount of charges, the measurement precision of the charging voltage Vs on the substrate surface is further enhanced. An example of the charging voltage measuring device 12 will be presented below.

Figure 4:
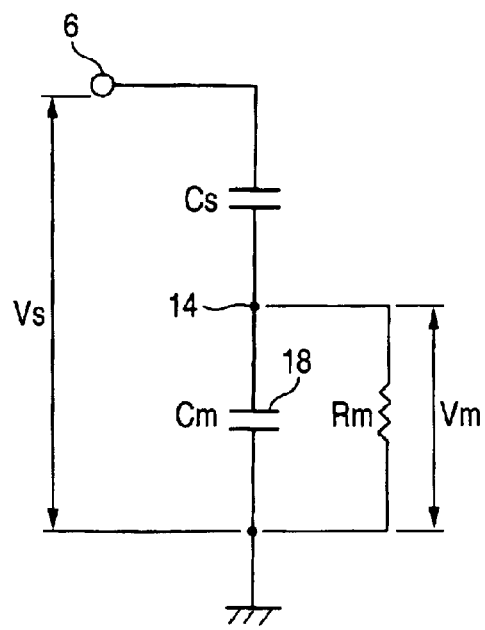
FIG. 4 is an equivalent circuit diagram around a measuring capacitor in FIG. 3.

FIG. 3 is a view showing a charging voltage measuring device according to another embodiment of the invention. FIG. 4 is an equivalent circuit diagram around the measuring capacitor in FIG. 3. In the following, the different points from the embodiment of FIGS. 1 and 2 will be chiefly described.

In this charging voltage measuring device 12, the measuring resistor 24 is connected in parallel to the measuring capacitor 18. Assuming that the resistance value of the measuring resistor 24 is R2 and the internal resistance value of the voltmeter 20 is R1, the resistance value Rm of a combination of both or the resistance value Rm of a resistor in parallel to the measuring capacitor 18 is represented in the following table.

$$Rm = R1 \cdot R2/(R1+R2) \qquad \text{[Numerical expression 5]}$$

The reason why the measuring resistor 24 is provided is that the measurement precision of the charging voltage Vs is enhanced by clarifying the resistance value Rm of the resistor in parallel to the measuring capacitor 18. Accordingly, when the internal resistance value R1 of the voltmeter 20 is clear, it is unnecessary to provide the measuring resistor 24. In this case, Rm is equal to R1. When the measuring resistor 24 is provided, the resistance value R2 is preferably fully smaller (about $1/10$) than the internal resistance value R1 of the voltmeter 20. In this way, in the synthetic resistance value Rm, the clear resistance value R2 of the measuring resistor 24 is predominant and less subject to influence of variations in the internal resistance value R1 of the voltmeter 20. If the resistance value R2 is too small, the time constant of the measuring circuit is excessively reduced, so that the amount of charges incident on the substrate 6 and thus the charging voltage Vs are varied over time, the charging voltage Vs is difficult to measure, whereby the resistance value R2 of the measuring resistor 24 is preferably from several kΩ to several MΩ.

The resistance value Rm may be calculated within the calculator 22, or by may be calculated in other ways and set in the calculator 22, whereby the calculator 22 makes the calculation in accordance with the numerical expression 2. Thereby, the arithmetical operation of the calculator 22 is simplified.

The voltmeter 20 always measures the measuring voltage Vm across the measuring capacitor 18 during the measurement and passes it to the calculator 22. The calculator 22 makes the following calculation. That is, assuming that the time is t, and the measuring voltage Vm is represented by Vm(t) as the function of time, when the measurement start time is t=0, and arbitrary time (e.g., when the charging voltage Vs is desired to know) during the measurement is t1, the charging voltage Vs on the surface of the substrate 6 at arbitrary time t1 during treatment and measurement is calculated in accordance with the numerical expression 2 on the basis of the inverse K of the voltage dividing ratio, the resistance value Rm and the measuring voltage Vm(t1) at time t1. The measurement start time may be the time when the surface of the substrate 6 is not electrified without mistake, and set to t=0. The unit in the numerical expression 2 is SI unit, and the unit of time is second.

A portion of the first term Vm(t1) within large brackets in the numerical expression 2 multiplied by K is almost the same content as in the numerical expression 1. The concept of time is only considered.

The second term $\{1/(Cm \cdot Rm)\} \int_0^{t1} Vm(t)dt$ within the large brackets in the numerical expression 2 is provided to correct for an amount of electrons on the substrate surface leaking into the ground potential portion through the resistance value Rm during the measurement by converting it into the voltage.

Explaining in more detail, $\{Vm(t)/Rm\}dt$ that is based on in the numerical expression 2 is the amount of charges leaking through the resistance value Rm per unit time, in which the sum of charges from time t=0 to time t1 is $(1/Rm)\int_0^{t1} Vm(t)dt$ and the charging voltage is corrected for this value, thereby enhancing the measurement precision of the charging voltage Vs. The reason why the sum is multiplied by 1/Cm is that the sum is converted into the voltage, employing the relation V=Q/C (Q is charge and C is electrostatic capacity) for the capacitor.

The voltage in the second term within the large brackets in the numerical expression 2 is measured at the same location across the measuring capacitor 18, and converted into the voltage on the surface of the substrate 6 by multiplying it by the inverse K of the voltage dividing ratio. By making this conversion, the charging voltage Vs on the surface of the substrate 6 being actually treated is measured more accurately by correcting for an error due to charges leaking into the ground potential portion via the resistance value Rm during the measurement.

The inverse K of the voltage dividing ratio is calculated (actually measured) simply and correctly in the following way. The value K varies depending on both a thickness of the substrate and a dielectric constant of the substrate. Therefore, the value of K is determined before irradiating an ion beam.

Figure 6:
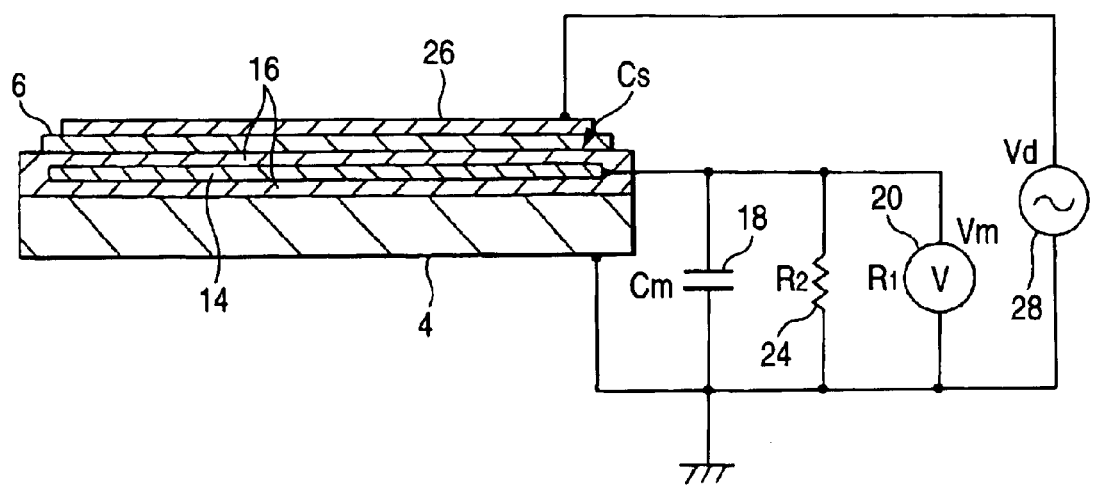
FIG. 6 is a diagram showing one example of a method for acquiring an inverse of voltage dividing ratio.

That is, a dummy electrode 26 for simulating the electrification is placed closely on the surface of the substrate 6, a dummy voltage Vd from a dummy power source 28 is applied between it and the ground potential portion to measure the measuring voltage Vm across the measuring capacitor 18 using the voltmeter 20, as shown in FIG. 6. An apparatus for irradiating the ion beam is exposed in the atmosphere when simulating the electrification by using the dummy electrode 26. Therefore, the dummy electrode 26 does not prevent irradiating the ion beam on the substrate. The dummy electrode 26 is a conductor plate such as an aluminum foil. The dummy voltage Vd is preferably a sinusoidal AC voltage. In this way, the dummy power source 28 is simplified, and the dummy voltage Vd is repeatedly applied, thereby producing a state relatively close to the state where the substrate holding unit 4 and the substrate 6 are mechanically scanned by the ion beam 2. The dummy voltage Vd is not necessarily the sinusoidal AC voltage, but only needs to have a portion where the value is varied over time. For example, a DC voltage at a moment when it is applied, or a rectangular voltage may be possible.

The dummy voltage Vd is applied on the surface of the substrate 6, like the charging voltage Vs, to simulate the charging voltage Vs on the substrate surface, wherein it is considered that Vd is equal to Vs. If this relation is substituted for the numerical expression 3 or 4, the inverse K of the voltage dividing ratio is obtained from the following numerical expression 6 or 7. In the charging voltage measuring device 12 of FIG. 1 with the numerical expression 3, the numerical expression 6 may be employed, while in the charging voltage measuring device 12 of FIG. 3 with the numerical expression 4, the numerical expression 7 may be employed. When the inverse K of the voltage dividing ratio in the numerical expression 8 is employed, the measuring resistor 24 is not provided.

$$K = Vd/Vm \qquad \text{[Numerical expression 6]}$$

$$K = Vd/[Vm(t1) + \{1/(Cm \cdot Rm)\}\int_0^{t1} Vm(t)dt] \qquad \text{[Numerical expression 7]}$$

The charging voltage measuring device 12 may be applied to other cases than where the substrate 6 is irradiated with the ion beam 2 for ion implantation or ion doping. For example, the charging voltage measuring device 12 may be applied to the process or apparatus in which the surface of the substrate is possibly electrified such as the process or apparatus for making the plasma treatment on the substrate, or process or apparatus for conveying or drying the substrate.

An example of the ion beam irradiating device will be described below, which includes the charging voltage measuring device 12 as shown in FIGS. 1 and 3 and makes the feedback control so that the charging voltage Vs on the substrate surface during the treatment that is measured by it falls within the reference voltage range.

This ion beam irradiating device radiates the ion beams 2 onto the substrate 6 held on the substrate holding unit to make the ion implantation or ion doping within the vacuum vessel 30.

The measuring electrode 14 constituting the charging voltage measuring device 12 is provided between the substrate holding unit 4 and the substrate 6. Herein, the insulating layer 16 is not shown. One example of the planar shape of this measuring electrode 14 is shown in FIG. 9. This is the same figure as FIG. 5. A portion of the measuring capacitor 18, the voltmeter 20, the calculator 22 and the measuring resistor 24 is collectively shown as a circuit 17, from which the charging voltage Vs measured in the above way is output. That is, the charging voltage measuring device 12 is made up of the measuring electrode 14 and the circuit 17.

In this example, the substrate holding unit 4, the substrate mounted thereon and the measuring electrode 14 are mechanically driven (scanned) in the reciprocating motion in the X direction of the arrow by a driving device 32.

The ion beam 2 is not scanned in this example. The sectional shape of this ion beam 2 is a rectangle that is longer in the Y direction orthogonal to the X direction, and one example thereof is shown in FIG. 9. The width of the ion beam 2 in the X direction is actually slightly narrower, but shown widely. The ion beam 2 may be scanned in the form of spot in the Y direction.

A plasma generating device 34, as one example of the electron supply source, for generating electrons, supplying them to the substrate 6 and suppressing electrification on the substrate surface from being caused by the ion beam irradiation is provided near the substrate holding unit 4 and the substrate 6 upstream side thereof.

This plasma generating device 34 generates a plasma (naturally containing electrons) 40 by introducing a gas into a plasma generating vessel 36, generating an arc discharge between a filament 38 and the plasma generating vessel 36, and ionizing the gas, and thereby supplies the plasma to the passage of the ion beam 2 to supply electrons in the plasma 40 along with the ion beam 2 to the substrate 7 to suppress electrification on the substrate surface. The filament 38 is heated by a voltage variable filament power source 42. An arc discharge voltage from an arc power source 44 is applied between the filament 38 and the plasma generating vessel 36. An extraction voltage for facilitating the extraction of plasma is applied from an extraction power source 46 between the plasma generating vessel 36 and a beam line tube 31 leading to the vacuum vessel 30.

Moreover, this ion beam irradiating device includes a controller for maintaining the amount of plasma 40 generated from the plasma generating device 34, when the charging voltage Vs is within a reference voltage range RV, increasing the amount of plasma 40 generated from the plasma generating device 34 when it is higher than the reference voltage range RV, or decreasing the amount of plasma 40 generated from the plasma generating device 34 when it is lower than the reference voltage range RV on the basis of the charging voltage Vs of the substrate measured by the charging voltage measuring device 12.

When the amount of plasma 40 generated from the plasma generating device 34 is increased, an upward instruction signal UP is supplied from the controller 48 to the filament power source 42 to increase its output voltage. As a result, the filament current, the amount of discharge electrons from the filament 38, the arc discharge current, and the amount of generating the plasma 40 are increased. When the amount of plasma 40 generated from the plasma generating device 34 is decreased, an downward instruction signal DN is supplied from the controller 48 to the filament power source 42 to increase its output voltage. As a result, owing to an opposite action, the amount of generating the plasma 40 is decreased. When the amount of plasma 40 generated from the plasma generating device 34 is maintained, neither the upward instruction signal UP nor the downward instruction signal DN are supplied to the filament power source 42.

Figure 8:
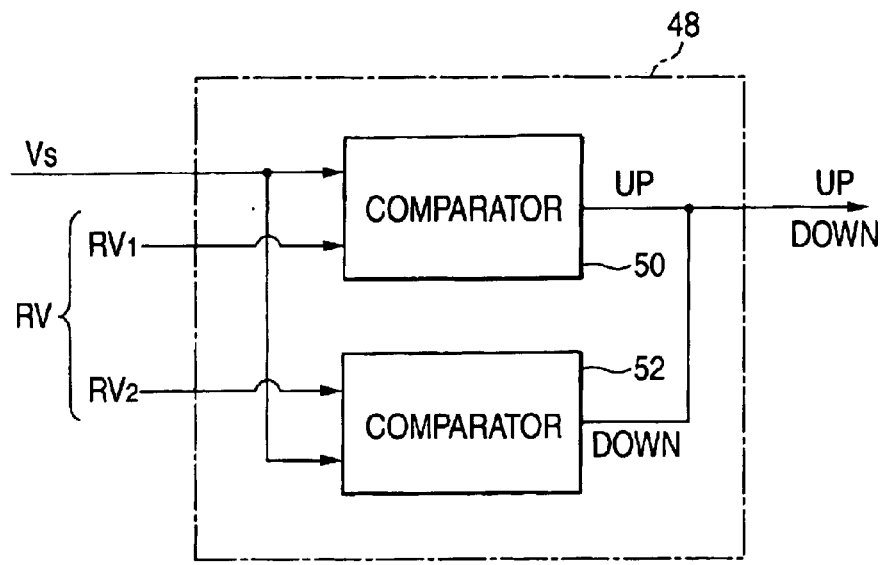
FIG. 8 is a block diagram showing a specific example of a controller in FIG. 7.

A specific example of the controller 48 is shown in FIG. 8. This controller 48 has a comparator 50 in which the upper limit value RV1 in the reference voltage range RV is set as the reference value, and a comparator 52 in which the lower limit value RV2 in the reference voltage range RV is set as the reference value. Both the comparators 50 and 52 are supplied with the charging voltage Vs as the comparison object from the charging voltage measuring device 12. When the charging voltage Vs is higher than the upper limit value RV1, the upward instruction signal UP is output from the comparator 50. When the charging voltage Vs is lower than the lower limit value RV2, the downward instruction signal DN is output from the comparator 52. When the charging voltage Vs lies between the upper limit value RV1 and the lower limit value RV2, neither the signal UP nor DN are output.

It is the concept including the polarity ± of the charging voltage Vs that the charging voltage Vs measured by the charging voltage measuring device 12 is higher or lower than the reference voltage range RV. For example, when the reference voltage range RV is $-3 \leq RV \leq +3[V]$, (a) the amount of generating the plasma 40 is maintained if the charging voltage Vs is within this range, and (b) the amount of generating the plasma 40 is increased if the charging voltage Vs is higher than +3V, for example, +6V. Thereby, in the plasma 40 supplied to the substrate 6, the amount of electrons is increased so that a positive charge up on the substrate surface is decreased the absolute value of the charging voltage Vs is reduced. Moreover, (c) the amount of generating the plasma 40 is decreased if the charging voltage Vs is lower than −3V, for example, −6V. Thereby, the plasma 40 supplied to the substrate 6 or the amount of electrons is decreased, so that a negative charge up on the substrate surface is decreased and the absolute value of the charging voltage Vs is reduced.

Because this ion beam irradiating device has the charging voltage measuring device 12, the charging voltage Vs on the substrate surface being actually treated is accurately measured.

Additionally, since the controller 48 makes the feedback control to the plasma generating device 34, the charging voltage Vs on the substrate surface being treated is automatically controlled to be within the reference voltage range RV.

For the electron supply source for suppressing the electrification, an electron generating device for generating electrons alone for supply to the substrate 6 or the ion beam 2 may be employed, instead of the plasma generating device 34 for generating the plasma 40 containing electrons.

The measuring electrode 14 constituting the charging voltage measuring device 12 in each embodiment is not limited to one sheet, but may be a plurality of sheets, each sheet being provided with the measuring capacitor 18 (the measuring resistor 24, as needed), the measuring voltage Vm across the measuring capacitor 18 is measured, the charging voltage Vs on the substrate surface at multiple locations corresponding to the measuring electrodes 14 may be measured by calculation in accordance with the numerical expression 3 or 4, employing the measured voltage Vm. In this way, the distribution of charging voltage Vs on the substrate surface is also measured. To measure the measuring voltage Vm at multiple locations, a data logger for measuring the voltage at a plurality of locations may be employed, instead of a plurality of voltmeters 20.

Figure 10:
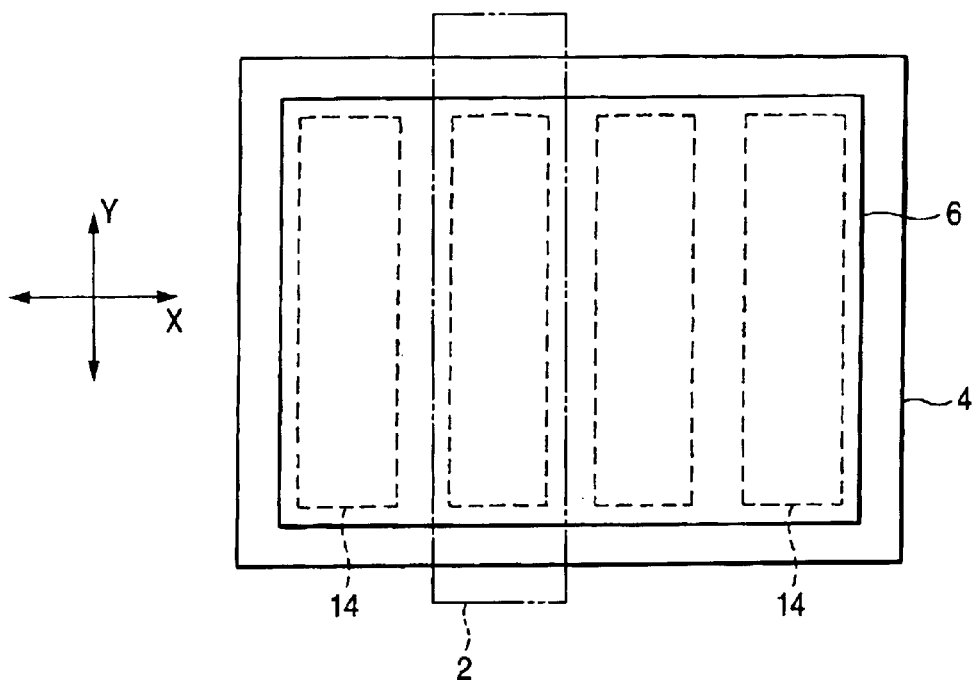
FIG. 10 is a plan view showing another example of a measuring electrode.

For example, when the substrate holding unit is mechanically scanned in the X direction, a plurality of measuring electrodes 14 may be disposed in the X direction in the example as shown in FIG. 10. In this way, the distribution of charging voltage Vs on the substrate surface in the X direction is measured. In this case, each measuring electrode 14 is preferably a width equal or slightly smaller than that of the ion beam 2 in the X direction.

Figure 11:
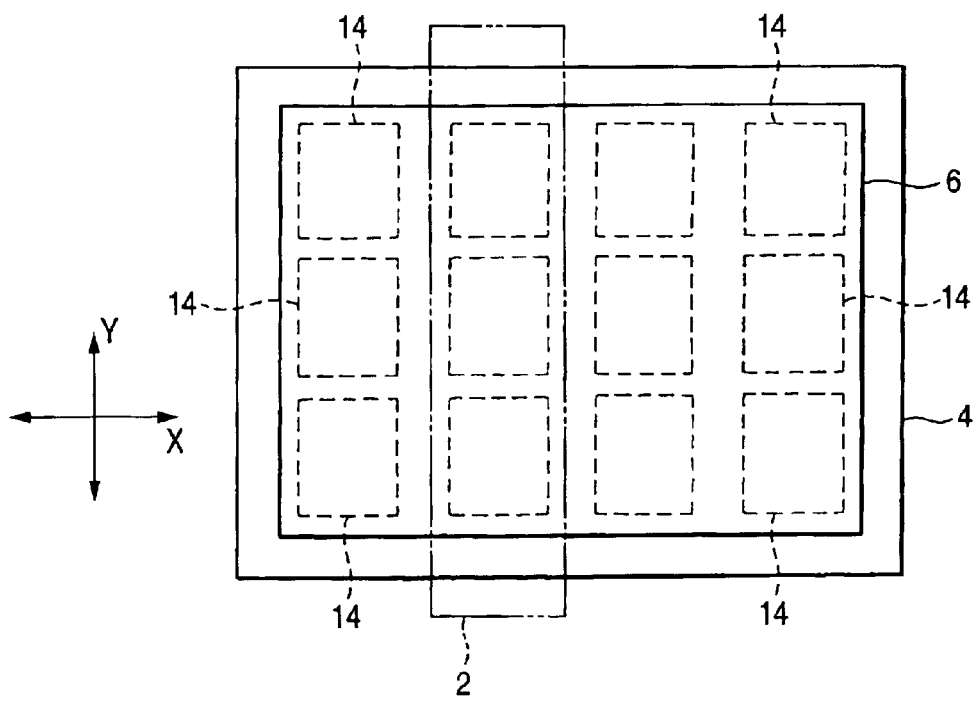
FIG. 11 is a plan view showing a further example of the measuring electrode.

Moreover, a plurality of measuring electrodes 14 may be disposed in the Y direction in the example as shown in FIG. 11. In this way, the distribution of charging voltage Vs on the substrate surface in the Y direction can be measured.

In the case wherein the plurality of measuring electrode 14 are provided to measure the charging voltage Vs at the plurality of locations, the electron supply source (e.g., plasma generating device 34) is controlled so that the maximum absolute value of charging voltage Vs at the plurality of locations may fall within the reference voltage range RV.

Also, this invention is applied to the case where an ionizer is employed to generate the positive and negative ions for supply to the substrate 6. This ionizer is employed to suppress the electrification of the substrate surface, when the substrate 6 is conveyed or dried in the atmosphere. In this case, the charging voltage measuring device 12 may be constituted by providing the measuring electrode 14 on the substrate holding unit 4 for conveying or drying the substrate 6. Moreover, employing the charging voltage Vs on the substrate surface that is measured by the charging voltage measuring device 12, the ionizer is subjected to the feedback control so that the charging voltage Vs may fall within the reference voltage range by changing the percentage of positive ions to negative ions that are generated from the ionizer on the basis of the same idea of the embodiment as shown in FIG. 7.

EFFECT OF THE INVENTION

This invention is constituted in the above way and has the following effects.

According to the first aspect of the invention, since the measuring electrode that is not an obstacle for treatment of the substrate is employed, the charging voltage on the surface of the substrate being actually treated can be measured in real time. In addition, the charging voltage on the surface of the substrate itself to be actually treated is measured employing voltage dividing unit with two electrostatic capacities, whereby the charging voltage on the substrate surface is accurately measured.

According to second aspect of the invention, since the measuring electrode that is not an obstacle for treatment of the substrate is employed, the charging voltage on the surface of the substrate being actually treated can be measured in real time. In addition, the voltage is corrected for an amount of charges on the substrate surface leaking through the resistor in parallel to the measuring capacitor such as the internal resistor of the voltmeter into the ground potential portion during the measurement by converting it into the voltage on the substrate surface, whereby the charging voltage on the substrate surface being actually treated is accurately measured by correcting for an error due to the leakage.

According to third aspect of the invention, since the charging voltage measuring device according to first or second aspect of the invention is provided, the charging voltage on the substrate surface being actually treated is accurately measured. Additionally, the controller is provided to make the feedback control for the electron discharge source to automatically control the charging voltage on the substrate surface being actually treated to fall within the reference voltage range.

What is claimed is:

1. A charging voltage measuring apparatus for measuring a charging voltage Vs on the surface of a substrate on a substrate holding unit, comprising:

a measuring electrode, for forming an electrostatic capacity Cs with said substrate, being disposed on said substrate holding unit to make contact with or proximate to the back face of said held substrate, and said measuring electrode being electrically insulated from said substrate holding unit;

a measuring capacitor connected between said measuring electrode and a ground potential portion, said measuring capacitor having an electrostatic capacity Cm;

a voltage measuring unit for measuring a measuring voltage Vm between both ends of said measuring capacitor; and a calculating unit for calculating said charging voltage Vs in accordance with a following numerical expression, Vs=K×Vm where K=(Cs+Cm)/Cs or K=(Cm/Cs) (if Cm>Cs), or its mathematically equivalent numerical expression on the basis of an inverse K of a voltage dividing ratio that is defined by the relation of said electrostatic capacities Cs and Cm and said measuring voltage Vm.

2. An ion beam irradiating device apparatus for irradiating an ion beam onto a substrate held on a substrate holding unit, comprising:

an plasma generating source for generating and supplying electrons to said substrate to suppress the electrification on the surface of said substrate caused by irradiating said ion beam;

a charging voltage measuring device for the substrate according to claim 1; and a controller unit for controlling an amount of electrons generated from said electron supply source on the basis of charging voltage Vs measured by said charging voltage measuring device;

wherein said control unit controls to maintain said amount of said electrons generated from said electron supply source when said charging voltage Vs is within a reference voltage range, wherein said control unit controls to increase said amount of said electrons generated from said electron supply source when said charging voltage Vs is higher than said reference voltage range, and wherein said control unit controls to decrease said amount of said electrons generated from said electron supply source when said charging voltage Vs is lower than said reference voltage range.

3. The charging voltage measuring device according to claim 1, wherein said measuring electrode is a conductive plate covered with an insulating layer.

* * * * *

UNITED STATES PATENT AND TRADEMARK OFFICE
CERTIFICATE OF CORRECTION

PATENT NO. : 6,943,568 B2
DATED : September 13, 2005
INVENTOR(S) : Shuichi Maeno It is certified that error appears in the above-identified patent and that said Letters Patent is hereby corrected as shown below:

Column 12,
Line 31, "an plasma" should read -- a plasma --.

Signed and Sealed this

Tenth Day of January, 2006

JON W. DUDAS
*Director of the United States Patent and Trademark Office*